(12) United States Patent
Yu et al.

(10) Patent No.: US 12,527,086 B2
(45) Date of Patent: Jan. 13, 2026

(54) ARRAY SUBSTRATE AND DISPLAY PANEL

(71) Applicant: Wuhan China Star Optoelectronics Semiconductor Display Technology Co., Ltd., Hubei (CN)

(72) Inventors: Pei Yu, Hubei (CN); Le Zhang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 1235 days.

(21) Appl. No.: 17/418,920

(22) PCT Filed: May 18, 2021

(86) PCT No.: PCT/CN2021/094247
§ 371 (c)(1),
(2) Date: Nov. 10, 2022

(87) PCT Pub. No.: WO2022/233069
PCT Pub. Date: Nov. 10, 2022

(65) Prior Publication Data
US 2024/0038771 A1 Feb. 1, 2024

(30) Foreign Application Priority Data
May 7, 2021 (CN) .................. 202110494808.X (51) Int. Cl.
*H01L 27/12* (2006.01)
*G02F 1/1362* (2006.01)
*G02F 1/1368* (2006.01)
*H10D 86/40* (2025.01)
*H10D 86/60* (2025.01)
*H10K 59/131* (2023.01)
*H10K 77/10* (2023.01)

(52) U.S. Cl.
CPC ....... *H10D 86/60* (2025.01); *G02F 1/136295* (2021.01); *G02F 1/1368* (2013.01); *H10D 86/411* (2025.01); *H10D 86/441* (2025.01); *H10K 59/131* (2023.02); *H10K 77/111* (2023.02)

(58) Field of Classification Search
None
See application file for complete search history.

(56) References Cited

U.S. PATENT DOCUMENTS

2019/0148476 A1    5/2019  Park et al.
2019/0220644 A1*   7/2019  Sun .................. H10K 59/131
2020/0365672 A1   11/2020  Choi et al.

FOREIGN PATENT DOCUMENTS

CN    107424957    12/2017
CN    107845643     3/2018

(Continued)

*Primary Examiner* — William C Trapanese (57) ABSTRACT

The present application discloses an array substrate and a display panel. The array substrate comprises a flexible substrate, a thin-film transistor layer, a planarization layer, and a pixel electrode layer, wherein the thin-film transistor layer comprises driving circuit units and metal wires, a groove is defined between adjacent driving circuit units, and a plurality of protrusions are formed at positions where the groove overlaps the metal wires. The array substrate according to the present application improves stability of the array substrate.

19 Claims, 4 Drawing Sheets

(56) References Cited

FOREIGN PATENT DOCUMENTS

| CN | 107845643 A | * | 3/2018 | ........... H10D 86/451 |
|----|-------------|---|--------|-------------------------|
| CN | 108288637   |   | 7/2018 | |
| CN | 109638018   |   | 4/2019 | |
| CN | 109860252   |   | 6/2019 | |
| CN | 110581140   |   | 12/2019| |
| CN | 111682028   |   | 9/2020 | |
| CN | 112259582   |   | 1/2021 | |

* cited by examiner

ARRAY SUBSTRATE AND DISPLAY PANEL

RELATED APPLICATIONS

This application is a National Phase of PCT Patent Application No. PCT/CN2021/094247 having International filing date of May 18, 2021, which claims the benefit of priority of Chinese Patent Application No. 202110494808.X filed on May 7, 2021. The contents of the above applications are all incorporated by reference as if fully set forth herein in their entirety.

FIELD AND BACKGROUND OF THE INVENTION

The present disclosure relates to the field of display technology, in particular to an array substrate and a display panel.

With the development of screen technology, shapes of screens have become increasingly diversified, and flexible display devices have gradually become a mainstream development direction of the screen technology. An existing flexible display device usually fabricates TFT devices on a flexible and bendable substrate. In order to maintain flexibility, it is necessary to simultaneously increase bendability of in-plane TFT devices. Currently, a commonly used method is to provide grooves around each of the TFT devices and fill each of the grooves with organic materials to enhance the bendability.

However, when the organic materials are filled in the grooves, the organic materials easily overflow outside the grooves to form taper angles. When metal wires are produced in a subsequent process, problems such as metal etching residue are likely to occur near the taper angles, which are likely to cause line crosstalk. In addition, current display devices have higher and higher requirements for resolution. Under a requirement of ensuring a high resolution, an etching space for the metal wires is relatively narrow, and thus display abnormalities such as the line crosstalk caused by etching residue are more likely to occur.

Therefore, the existing flexible display device easily leads to metal wire etching residue due to the taper angles formed by overflow of the organic materials, and therefore, there are technical problems of display abnormality such as the line crosstalk, which need to be improved.

SUMMARY OF THE INVENTION

The purpose of the present disclosure is to solve problems in the prior art by providing protrusions at edges of grooves of an array substrate to prevent problems of metal wire crosstalk caused by an excessively small space at overflow taper angles, which leads to metal etching residue.

The present disclosure provides an array substrate, comprising:
  a flexible substrate;
  a thin-film transistor layer located on a surface of the flexible substrate;
  a planarization layer located on a surface of the thin-film transistor layer away from the flexible substrate; and
  a pixel electrode layer located on a surface of the planarization layer away from the flexible substrate,
  wherein the thin-film transistor layer comprises a plurality of driving circuit units and a plurality of metal wires, a groove is defined between adjacent driving circuit units and is filled with organic insulating materials, and the plurality of the metal wires extend across the groove;
  wherein a plurality of protrusions are formed at positions where the groove overlaps the plurality of metal wires, and the protrusions are distributed on at least one side of the groove along an extending direction of the metal wires.

In some embodiments, the thin-film transistor layer comprises a first insulating layer and an interlayer insulating layer sequentially stacked on the flexible substrate;
  each of the driving circuit units comprises an active layer formed between the flexible substrate and the first insulating layer, and a first metal layer formed between the first insulating layer and the interlayer insulating layer,
  wherein the groove penetrates the interlayer insulating layer.

In some embodiments, the groove penetrates the interlayer insulating layer and the first insulating layer, and extends into the flexible substrate.

In some embodiments, the plurality of metal wires are formed above the interlayer insulating layer and comprise data lines extending from sources or drains,
  wherein the protrusions are arranged at positions where the groove overlaps the data lines.

In some embodiments, the protrusions protrude from edges of the groove to outside of the groove along the extending direction of the metal wires, and widths of the protrusions are less than a width of the groove.

In some embodiments, wherein the protrusions corresponding to the adjacent metal wires are located on opposite sides of the groove.

In some embodiments, wherein adjacent protrusions on a same side of the groove have different widths.

In some embodiments, wherein each of the protrusions has a trapezoidal or inverted trapezoidal shape on a plane where the interlayer insulating layer extends.

In some embodiments, wherein an inclination degree of a side wall of a portion of the groove where the protrusions are not formed is less than an inclination degree of a side wall of each of the protrusions.

In some embodiments, wherein the array substrate further comprises a second insulating layer and a second metal layer,
  wherein the second insulating layer is located on a side of the first metal layer away from the first insulating layer, and the second metal layer is located between the second insulating layer and the interlayer insulating layer, and
  wherein the groove penetrates the interlayer insulating layer, the second insulating layer, and the first insulating layer, and extends into the flexible substrate.

The present disclosure further provides a display panel, wherein the display panel comprises an array substrate, comprising:
  a flexible substrate;
  a thin-film transistor layer located on a surface of the flexible substrate;
  a planarization layer located on a surface of the thin-film transistor layer away from the flexible substrate; and
  a pixel electrode layer located on a surface of the planarization layer away from the flexible substrate,
  wherein the thin-film transistor layer comprises a plurality of driving circuit units and a plurality of metal wires, a groove is defined between adjacent driving circuit units and is filled with organic insulating materials, and the plurality of the metal wires extend across the groove;
  wherein a plurality of protrusions are formed at positions where the groove overlaps the plurality of metal wires, and the protrusions are distributed on at least one side of the groove along an extending direction of the metal wires.

In some embodiments, the thin-film transistor layer comprises a first insulating layer and an interlayer insulating layer sequentially stacked on the flexible substrate;

each of the driving circuit units comprises an active layer formed between the flexible substrate and the first insulating layer, and a first metal layer formed between the first insulating layer and the interlayer insulating layer, wherein the groove penetrates the interlayer insulating layer.

In some embodiments, wherein the groove penetrates the interlayer insulating layer and the first insulating layer, and extends into the flexible substrate.

In some embodiments, the plurality of metal wires are formed above the interlayer insulating layer and comprise data lines extending from sources or drains, wherein the protrusions are arranged at positions where the groove overlaps the data lines.

In some embodiments, wherein the protrusions protrude from edges of the groove to outside of the groove along the extending direction of the metal wires, and widths of the protrusions are less than a width of the groove.

In some embodiments, wherein the protrusions corresponding to the adjacent metal wires are located on opposite sides of the groove.

In some embodiments, adjacent protrusions on a same side of the groove have different widths.

In some embodiments, each of the protrusions has a trapezoidal or inverted trapezoidal shape on a plane where the interlayer insulating layer extends.

In some embodiments, an inclination degree of a side wall of a portion of the groove where the protrusions are not formed is less than an inclination degree of a side wall of each of the protrusions.

In some embodiments, the array substrate further comprises a second insulating layer and a second metal layer, wherein the second insulating layer is located on a side of the first metal layer away from the first insulating layer, and the second metal layer is located between the second insulating layer and the interlayer insulating layer, and wherein the groove penetrates the interlayer insulating layer, the second insulating layer, and the first insulating layer, and extends into the flexible substrate.

Beneficial effect: In the array substrate and the display panel provided by the present disclosure, the protrusions are arranged at the edges of the groove, so that when the organic materials filled in the groove overflow, the overflow portions are staggered, thereby preventing the problem of crosstalk due to the connection of the metal wires, which is caused by the metal etching residue due to excessively small space at the overflow taper angles, and therefore the stability of the array substrate is improved and the failure rate is reduced.

BRIEF DESCRIPTION OF THE SEVERAL VIEWS OF THE DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION OF SPECIFIC EMBODIMENTS OF THE INVENTION

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the description of the present disclosure, it should be noted that the terms "installation", "connection" and "coupling" should be understood in a broad sense, unless otherwise clearly specified and defined. For example, it can be a fixed connection, a detachable connection, or integrated connection; it can be a mechanical connection, an electrical connection or can communicate with each other; it can be directly connected or indirectly connected through an intermediary, it can also be the connection between two elements or the interaction between two elements. Those ordinary skilled in the art can understand the specific meanings of the above terms in the present disclosure according to specific situations.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Figure 1:
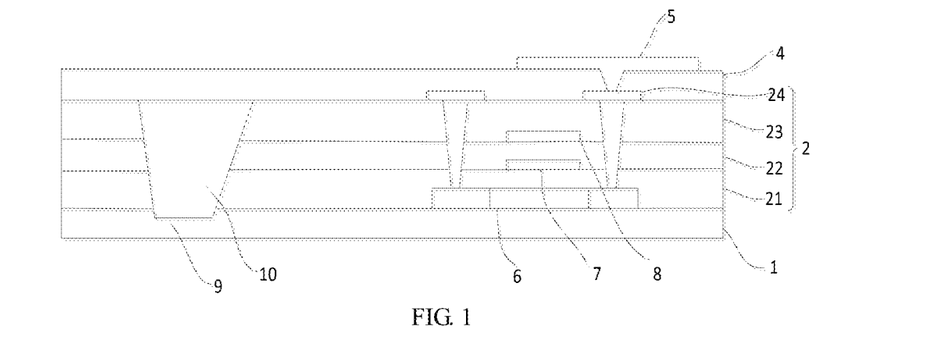
FIG. 1 shows a schematic cross-sectional view of an array substrate according to an embodiment of the present disclosure.

FIG. 1 shows a schematic diagram of an array substrate according to an embodiment of the present disclosure.

As shown in FIG. 1, an array substrate comprises a flexible substrate 1, a thin-film transistor layer 2, a planarization layer 4, and a pixel electrode layer 5 stacked in sequence. Wherein, the thin-film transistor layer 2 is located on a surface of the flexible substrate 1; the planarization layer 4 is located on a surface of the thin-film transistor layer 2 away from the flexible substrate 1; and the pixel electrode layer 5 is located on a surface of the planarization layer 4 away from the flexible substrate 1. In addition, the thin-film transistor layer 2 comprises a plurality of driving circuit units and a plurality of metal wires 24, and a groove 9 is defined between adjacent driving circuit units. The groove 9 is filled with organic insulating materials.

Figure 4:
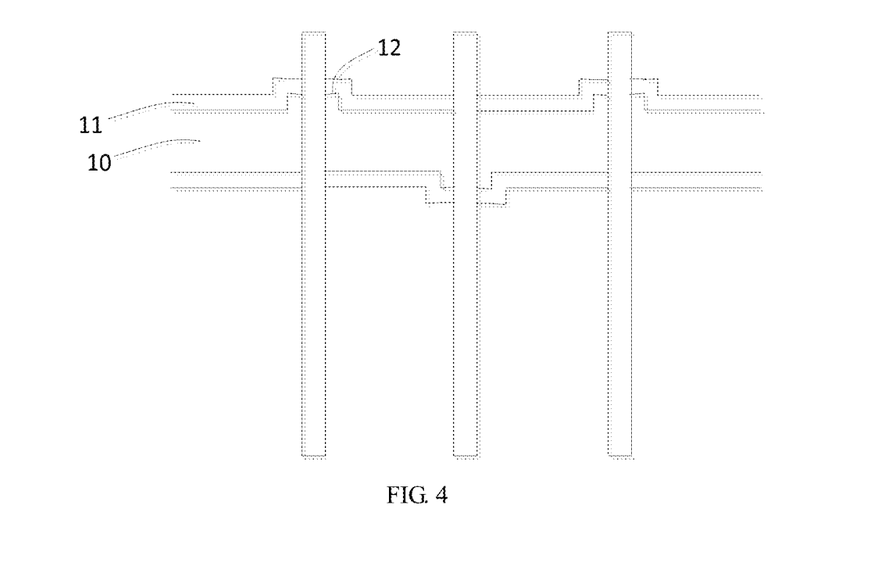
FIG. 4 shows a schematic diagram of a groove according to an embodiment of the present disclosure.

In addition, please refer to FIG. 4. FIG. 4 shows a schematic diagram of the groove according to an embodiment of the present disclosure. As shown in FIG. 4, the plurality of metal wires extend across the groove 9. Wherein, protrusions 12 are formed at positions where the groove 9 overlaps the metal wires, and the protrusions 12 formed are distributed on at least one side of the groove 9 along an extending direction of the metal wires. Further, in some embodiments, the protrusions 12 corresponding to adjacent metal wires are located on opposite sides of the groove 9.

The flexible substrate 1 may be made of flexible materials such as polyimide (PI). The flexible substrate 1 may have a multilayer structure, for example, the flexible substrate 1 may comprise a two-layer substrate of a first flexible substrate and a second flexible substrate. In addition, a barrier layer made of inorganic materials may be disposed on a side of the flexible substrate 1 close to the thin-film transistor layer 2 to block intrusion of external water and oxygen.

The thin-film transistor layer 2 comprises a first insulating layer 21, a second insulating layer 22, and an interlayer insulating layer 23 that are sequentially stacked. Wherein, the first insulating layer 21, the second insulating layer 22, and the interlayer insulating layer 23 are all formed of inorganic materials.

Each driving circuit unit included in the thin-film transistor layer 2 comprises an active layer 6 formed between the flexible substrate 1 and the first insulating layer 21, a first metal layer 7 formed between the first insulating layer 21 and the second insulating layer 22, and a second metal layer 8 formed between the second insulating layer 22 and the interlayer insulating layer 23. The active layer 6 comprises a channel region and source and drain regions located at both ends of the channel region. The active layer 6 is covered by the first insulating layer 21 so that the active layer 6 is interposed between the flexible substrate 1 and the first insulating layer 21. The first metal layer 7 is formed on the first insulating layer 21 at a position corresponding to the active layer 6, and is covered by the second insulating layer 22. In addition, the second metal layer 8 is disposed on the second insulating layer 22, and is covered by the interlayer insulating layer 23. Wherein, the first metal layer 7 and the second metal layer 8 may comprise a first gate electrode and a second gate electrode, respectively. In some embodiments, only the first metal layer comprising the first gate electrode may be disposed, and the first metal layer is covered by the interlayer insulating layer.

In some embodiments, the groove 9 penetrates the interlayer insulating layer 23. However, a depth of the groove 9 is not limited to this. In some embodiments, the groove 9 may extend downward from the interlayer insulating layer 23, penetrate the interlayer insulating layer 23, the second insulating layer 22, and the first insulating layer 21, and extend into the flexible substrate 1.

In some embodiments, the groove 9 may only penetrate the interlayer insulating layer 23, the second insulating layer 22, and the first insulating layer 21, without extending into the flexible substrate 1, so as to prevent strength of the flexible substrate 1 from being reduced, which will cause damage to the flexible substrate 1 due to stress accumulation during a bending process. In some embodiments, the groove 9 does not completely penetrate all the insulating layers, but only penetrates the interlayer insulating layer 23, the second insulating layer 22, and part of the first insulating layer 21 to improve bendability while maintaining the strength of the array substrate.

Further refer to FIG. 1, side walls of the groove 9 may be inclined, and an aperture gradually becomes greater from a bottom to an opening of the groove, thereby facilitating filling of the organic materials.

The groove 9 is filled with the organic materials to form an organic insulating layer 10. An upper surface of the organic insulating layer 10 is flush with an upper surface of the interlayer insulating layer 23, so as to facilitate subsequent formation of other layer structures or metal wires.

The plurality of metal wires 24 are formed over the interlayer insulating layer 23. The metal wires 24 comprise data lines extending from sources or drains. In addition, as shown in FIG. 1, each of the sources and drains are connected to the source and drain regions of the active layer 6 below through vias formed in the first insulating layer 21, the second insulating layer 22, and the interlayer insulating layer 23. In some embodiments, the protrusions 12 are disposed at positions where the date wires overlap the groove.

The planarization layer 4 is formed above the metal wires 24, and the pixel electrode layer 5 is formed above the planarization layer 4. The pixel electrode layer 5 comprises a pixel electrode, which is connected to the drain located below through a via formed in the planarization layer 4.

In addition, a buffer layer may be further disposed between the flexible substrate 1 and the active layer 6. The buffer layer may be formed by a technique such as chemical vapor deposition, and may be a silicon oxide film, a silicon nitride film, or a composite film formed by alternately stacking a silicon oxide film and a silicon nitride film to further block the intrusion of external water and oxygen.

In the embodiment of the present disclosure, the first insulating layer 21, the second insulating layer 22, and the interlayer insulating layer 23 are all inorganic insulating layers. However, hardness of the inorganic insulating layers is relatively high, and in order to improve the bendability of the array substrate and prevent the array substrate from being damaged due to the stress accumulation during the bending process, in the present disclosure, the groove 9 is further defined between adjacent driving circuit units, and organic insulating materials are filled in the groove 9 to form the organic insulating layer. The organic materials have good flexibility and ductility, so the bendability of the array substrate is further improved by defining the groove 9 between adjacent driving circuit units and filling the grooves with organic materials.

Figure 2:
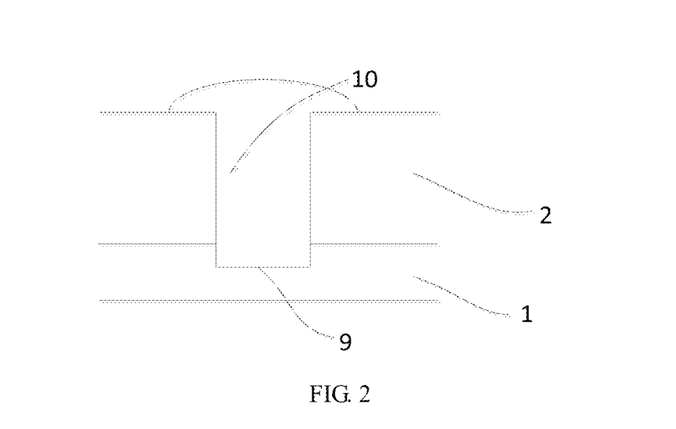
FIG. 2 shows a schematic diagram of forming an organic insulating layer in a groove in the prior art.
Figure 3:
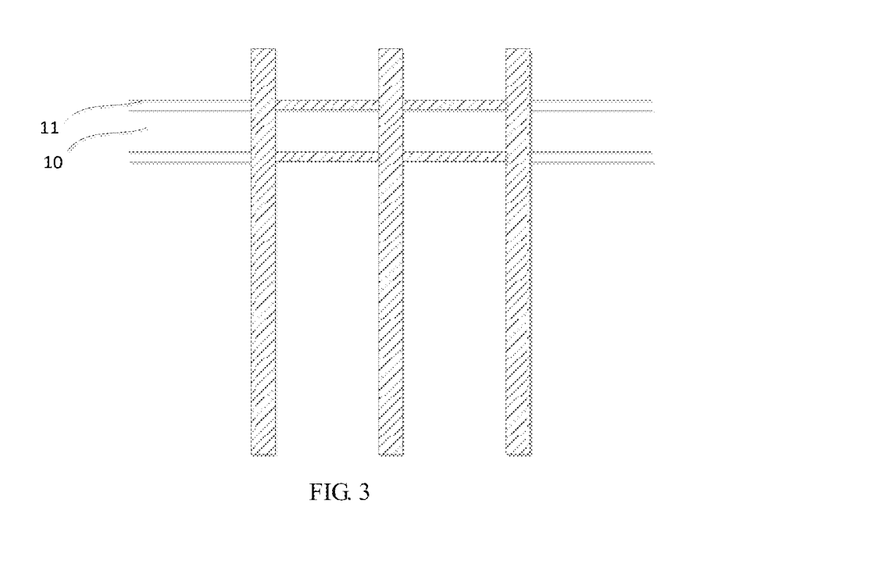
FIG. 3 shows a situation that metal wire etching residue occurs at edges of the groove in the prior art.

As shown in FIG. 2, FIG. 2 shows a schematic diagram of forming an organic insulating layer in a groove in the prior art. When filling the organic materials, the organic materials easily overflow and form protrusions at edges of the groove. Further refer to FIG. 3, FIG. 3 shows a situation that metal wire etching residue occurs at the edges of the groove in the prior art. The organic insulating layer 10 is filled in and overflows from the groove 9, and overflow portions 11 are formed at edges on both sides. When a data line layer is subsequently formed on the organic insulating layer and the interlayer insulating layer, it is necessary to pattern the data line layer to form a plurality of metal wires. However, the etching residue easily occurs at the overflow portions 11 and part of the data line layer remains, which leads to problems such as data crosstalk due to connection between the data lines.

Figure 5:
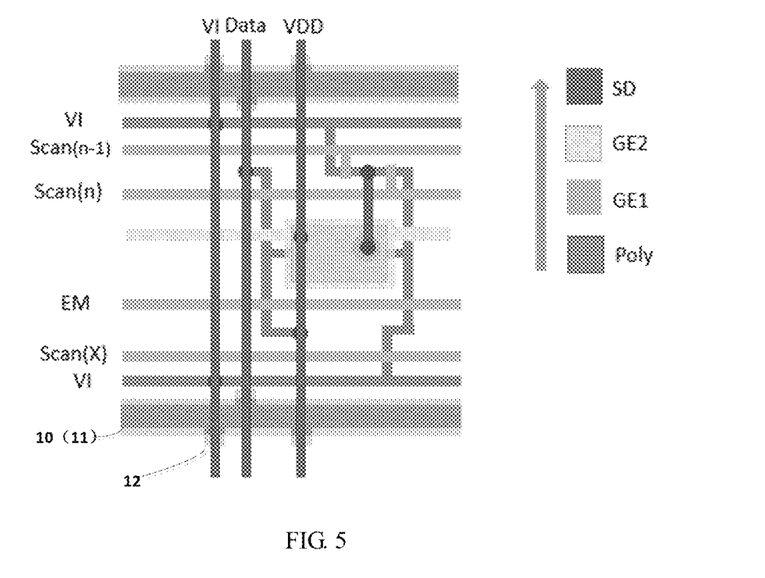
FIG. 5 shows a schematic diagram of a part of the array substrate comprising grooves according to an embodiment of the present disclosure.

Please refer to FIG. 5. FIG. 5 shows a schematic diagram of a part of the array substrate comprising the grooves according to an embodiment of the present disclosure. In FIG. 5, the grooves are defined on the upper and lower sides of the driving circuit unit comprising a source and drain layer, the gate electrode, and the active layer (an SD layer, a GE2 layer, a GE1 layer and a Poly layer shown in FIG. 5) and other structures. Each groove comprises an organic photoresist filled region filled with the organic insulating materials and an organic photoresist filled overflow region formed by overflow of the organic insulating materials. FIG. 5 shows that the pixel structure comprises a plurality of metal wires, which not only comprise metal wires extending in a same direction with the grooves such as voltage lines, scan lines, signal enable lines (VI, Scan, and EM shown in FIG. 5), but also comprise a plurality of metal wires extending longitudinally across the grooves, such as VI, Data, and VDD shown in FIG. 5. However, when the above-mentioned plurality of wires across the grooves are formed, residues caused by incomplete etching as shown in FIGS. 2 and 3 are prone to occur.

In order to prevent the above-mentioned problems, the protrusions 12 are formed at positions where the groove 9 overlaps the metal wires, so that the overflow portions are misaligned, thereby preventing connection between different wires due to continuous wire material remaining at the overflow portions, thereby reducing wire signals crosstalk between adjacent wires due to etching residue.

The protrusions may be formed at both edges of the groove that intersect with each metal wire, so that overflow taper angles of the organic layer are staggered, and the metal etching residue due to excessively small space at the overflow taper angles is prevented. In some embodiments, as shown in FIG. 4, the protrusions 12 may only formed at one edge of the groove 9 overlapping the metal wires, so as to prevent the hardness of the array substrate from being affected by an excessive overall width of the groove 9 and the protrusions 12.

In addition, in some embodiments, the protrusions corresponding to adjacent metal wires may be formed on different sides of the groove, and the protrusions are staggered to each other, so as to further increase the etching space near the overflow taper angles and prevent the problem of crosstalk between adjacent metal wires caused by the metal etching residue.

In some embodiments, a width of each of the protrusions is less than a width of the groove. Further, the width of each of the protrusions may be less than ¼ of the width of the groove, so as to prevent the widths of the groove and the protrusions from being too wide and affecting the hardness of the array substrate.

In some embodiments, the widths of the adjacent protrusions on a same side of the groove are different from each other, thereby further increasing the etching space near the overflow taper angles, and preventing the problem of crosstalk between adjacent metal wires caused by the metal etching residue.

The protrusions may have different shapes. In some embodiments, each of the protrusions may have a shape such as trapezoidal or inverted trapezoidal on a plane where the interlayer insulating layer extends. In some embodiments, each of the protrusions comprises two sides adjacent to the groove and a long side between the two sides. Wherein, an angle between each of the two sides and the edge of the groove may be a non-right angle, and the long side may form an angle with an extending direction of the edge of the groove. In other embodiments, the two sides and the long side of each of the protrusions may be curves.

Figure 6:
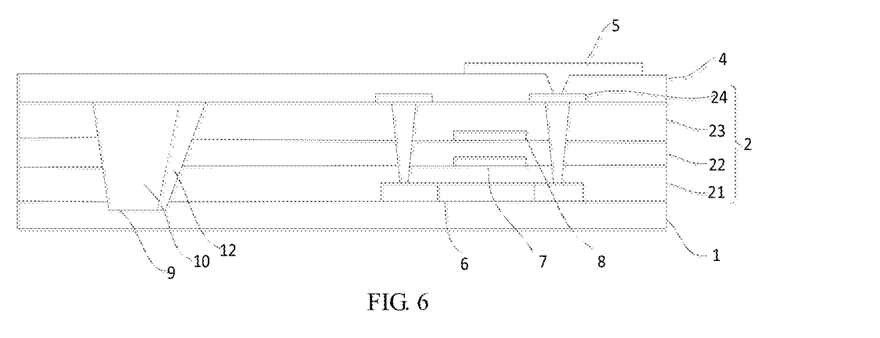
FIG. 6 shows a schematic cross-sectional view of the groove according to an embodiment of the present disclosure.

FIG. 6 shows a schematic cross-sectional diagram of the groove according to an embodiment of the present disclosure. Most elements in FIG. 6 are the same as those described with reference to FIG. 1, and therefore, only the groove is described in further detail, and the description of other elements is omitted.

As shown in FIG. 6, the protrusion 12 is formed at one side of the groove 9. The protrusion 12 and the groove are formed by etching under a same mask and have a same depth. The protrusion 12 may penetrate through all the insulating layers and extend into the flexible substrate 1. The protrusion 12 may also penetrate only parts of the insulating layers, so as to improve the bendability of the array substrate while maintaining the strength of the array substrate.

In other embodiments, the depths of the protrusion and the groove may be different, and the depth of the protrusion may be less than the depth of the groove to prevent the overall width and depth of the groove and the protrusion from being too great and affecting the hardness of the array substrate.

Further refer to FIG. 6, it can be seen that an inclination angle of a side wall of the protrusion 12 is different from an inclination angle of a side wall of the groove 9. A horizontal inclination angle formed by the sidewall of the protrusion 12 and the insulating layer may be less than a horizontal inclination angle formed by the sidewall of the groove 9 and the insulating layer, that is, an inclination degree of the sidewall of the protrusion 12 may be greater than an inclination degree of the groove 9. In some embodiments, the horizontal inclination angle of the sidewall of the groove 9 may range from 70 degrees to 85 degrees, and the horizontal inclination angle of the protrusion 12 may range from 60 degrees to 80 degrees, preferably 65 degrees. In the present disclosure, by setting the inclination angle of the protrusion to be less than that of the side wall of the groove, the side wall of the protrusion has a greater inclination degree, which can facilitate the filling of organic materials, reduce the overflow of the organic materials, prevent the formation of the taper angles, and reduce the crosstalk of the metal wires caused by the metal etching residue.

Therefore, in the array substrate of the present disclosure, the protrusions are disposed at positions that the edges of the groove overlapping the metal wires, so that the overflow portions of the organic materials filled in the groove are staggered, so as to prevent the problem of crosstalk due to the connection of the metal wires, which is caused by the metal etching residue due to excessively small space at the overflow taper angles, and therefore stability of the array substrate is improved and a failure rate is reduced.

Figure 7:
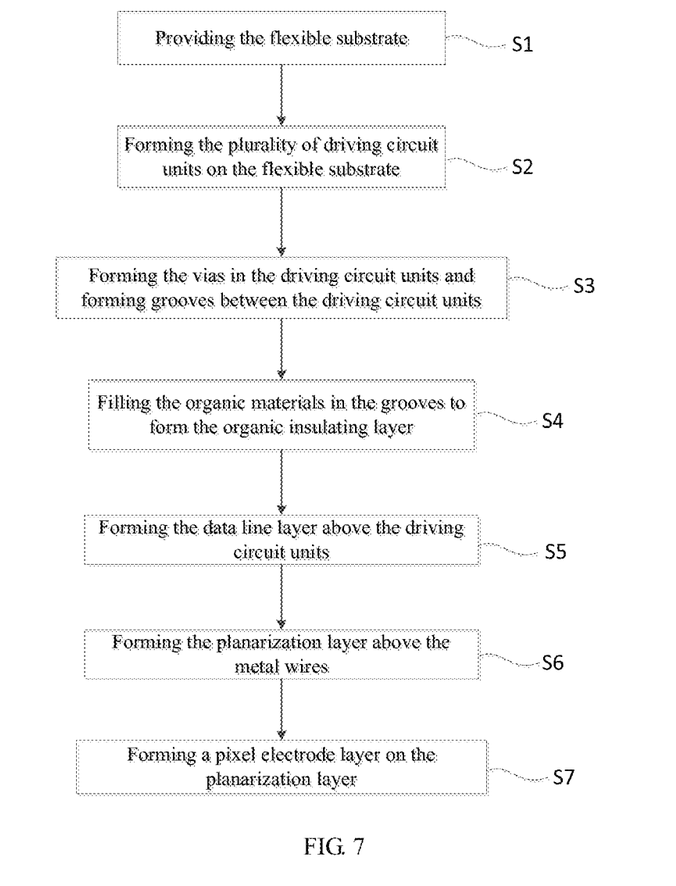
FIG. 7 shows a flowchart of a manufacturing method of an array substrate according to an embodiment of the present disclosure.
Figure 8:
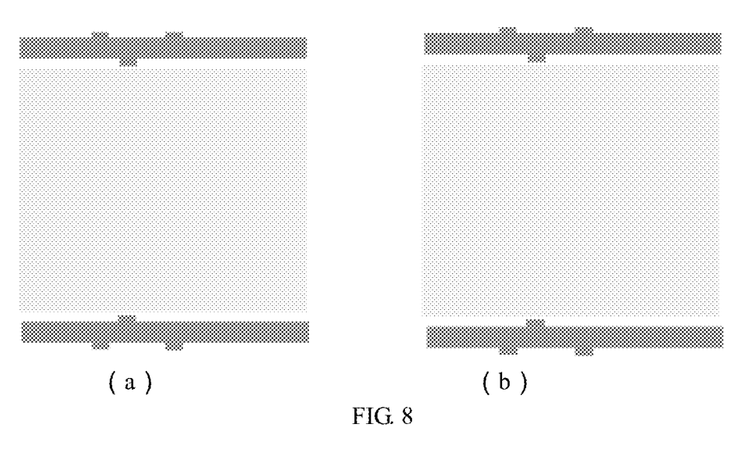
FIG. 8 shows a schematic diagram of a manufacturing method of grooves according to an embodiment of the present disclosure.

The present disclosure further provides a manufacturing method of the array substrate. FIG. 7 shows a flowchart of a manufacturing method of the array substrate according to an embodiment of the present disclosure. As shown in FIG. 7, the manufacturing method comprises steps S1 to S7. FIG. 8 shows a schematic diagram of a manufacturing method of the groove according to an embodiment of the present disclosure. FIG. 8(a) shows a formation step of the groove, and FIG. 8(b) shows a schematic diagram of the groove after filled the organic photoresist of the organic insulating materials according to an embodiment of the present disclosure. Hereinafter, the manufacturing method of the array substrate will be described with reference to FIGS. 7 and 8.

Step S1: Providing the Flexible Substrate.

The flexible substrate can be made of flexible materials such as polyimide (PI). The flexible substrate may have a multilayer structure, for example, a two-layer substrate comprising a first flexible substrate and a second flexible substrate. In addition, the barrier layer made of inorganic material can also be disposed on a side of the flexible substrate to block the intrusion of external water and oxygen.

Then, the thin-film transistor layer is formed on the flexible substrate. The thin-film transistor layer comprises the plurality of driving circuit units and the plurality of metal wires. The steps of forming the thin-film transistor layer specifically comprise:

Step S2: Forming the Plurality of Driving Circuit Units on the Flexible Substrate.

In addition, forming the driving circuit units comprise forming the active layer on the flexible substrate, and doping the active layer to form the source region and the drain region, and the active layer is covered by the first insulating layer. The first metal layer is formed on the first insulating layer at a position corresponding to the active layer, and the second metal layer is disposed on the second insulating layer. Wherein, the first metal layer and the second metal layer can be patterned as gate electrodes.

In addition, the buffer layer may be further disposed between the flexible substrate and the active layer. The buffer layer may be formed by techniques such as chemical vapor deposition. The buffer layer may be a silicon oxide film, a silicon nitride film or a composite film formed by alternately stacking a silicon oxide film and a silicon nitride film to further block the intrusion of the external water and oxygen.

Step S3: Forming the Vias in the Driving Circuit Units and Forming Grooves Between the Driving Circuit Units.

Through the etching process, the vias are formed in the driving circuit units to expose the source and drain regions of the active layer, and the grooves are formed between adjacent driving circuit units. The grooves may penetrate the interlayer insulating layer, the second insulating layer, and the first insulating layer and extend into the flexible substrate. In some embodiments, the grooves may only penetrate parts of the insulating layers to prevent the strength of the flexible substrate from being reduced, which can result in stress accumulation and damage to the flexible substrate during the bending process.

Step S4: Filling the Organic Materials in the Grooves to Form the Organic Insulating Layer.

The organic materials are filled in the grooves to form the organic insulating layer, and an upper surface of the organic insulating layer is flush with an upper surface of the interlayer insulating layer, so as to form other layer structure or metal wires.

S5: Forming the Data Line Layer Above the Driving Circuit Units.

The data line layer can be patterned into the metal wires such as the sources, the drains, and the data lines. Wherein, the sources and the drains are connected to the source and drain regions of the active layer below through the vias.

S6: Forming the Planarization Layer Above the Metal Wires.

In the display area, the via penetrating the planarization layer is formed in the planarization layer to expose the drain.

S7: Forming a Pixel Electrode Layer on the Planarization Layer.

The pixel electrode layer may be patterned as the pixel electrode. The pixel electrode is connected to the drain through the via in the planarization layer.

In addition, the protrusions are formed at positions where the grooves overlap the metal wires, so that overflow portions are misaligned, thereby preventing continuous wire material residue at the overflow portions from causing connection between different wires, thereby reducing wire signal crosstalk caused by the etching residue between adjacent wires.

In some embodiments, the groove may only form protrusions at one edge overlapping the metal wires, so as to prevent the overall width of the groove and the protrusions from being too wide and affecting the hardness of the array substrate. In addition, the protrusions corresponding to the adjacent metal wires can be formed at different sides of the groove, and the protrusions are arranged staggered to each other, thereby further increasing the etching space near the overflow taper angles and preventing the problem of crosstalk between the adjacent metal wires caused by the metal etching residue.

In the manufacturing method of the array substrate provided by the present disclosure, the protrusions are arranged at the edges of the groove, so that when the organic materials filled in the groove overflow, the overflow portions are staggered, thereby preventing the problem of crosstalk due to the connection of the metal wires, which is caused by the metal etching residue due to excessively small space at the overflow taper angles, and therefore the stability of the array substrate is improved and the failure rate is reduced.

The present disclosure further provides a display panel. The display panel comprises an array substrate, an upper substrate, and a display layer between the array substrate and the upper substrate, wherein the array substrate is the array substrate as described above.

The embodiment of the present disclosure provides a liquid crystal display panel. The liquid crystal display panel comprises an array substrate, a color film substrate, and a liquid crystal layer between the array substrate and the color film substrate.

Wherein, the array substrate may be the same as the flexible substrate described above. The color film substrate may comprise a glass substrate, a common electrode, a color filter layer, a black matrix, and the like disposed on the glass substrate. An electric field is formed between the common electrode and pixel electrodes on the array substrate to control deflection of liquid crystal molecules in the liquid crystal layer.

The embodiment of the present disclosure provides an OLED display panel. The OLED display panel comprises an array substrate, an upper substrate, and a light-emitting device layer between the array substrate and the upper substrate.

Wherein, the array substrate is basically the same as the flexible substrate described above. The light-emitting device layer may comprise a hole injection layer, a hole transport layer, a light-emitting layer, an electron transport layer, an electron injection layer, and the like. The upper substrate is also provided with a cathode electrode, which forms an electric field with pixel electrodes on the array substrate, so that the holes of the pixel electrodes and the electrons of the cathode electrode recombine in the light-emitting layer to make the light-emitting layer emit light.

In the array substrate and the display panel provided by the present disclosure, the protrusions are arranged at the edges of the groove, so that when the organic materials filled in the groove overflow, the overflow portions are staggered, thereby preventing the problem of crosstalk due to the connection of the metal wires, which is caused by the metal etching residue due to excessively small space at the overflow taper angles, and therefore the stability of the array substrate is improved and the failure rate is reduced.

The embodiments of the present disclosure are described in detail above, and specific examples are used in this article to illustrate the principles and implementation of the present disclosure. The descriptions of the above examples are only used to help understand the methods and core ideas of the present disclosure; at the same time, for persons of ordinary skill in the art, based on the ideas of the present disclosure, will have changes in the specific implementation and the scope of application. In summary, the content of this specification should not be construed as limiting the present disclosure.

What is claimed:

1. An array substrate, comprising:
   a flexible substrate;
   a thin-film transistor layer located on a surface of the flexible substrate;
   a planarization layer located on a side surface of the thin-film transistor layer away from the flexible substrate; and
   a pixel electrode layer located on a surface of the planarization layer away from the flexible substrate,
   wherein the thin-film transistor layer comprises a plurality of driving circuit units and a plurality of metal wires, a groove is defined between adjacent driving circuit units and is filled with organic insulating materials, and the plurality of metal wires extend across the groove; and
   wherein a plurality of protrusions are formed at positions where the groove overlaps the plurality of metal wires, and the protrusions are distributed on at least one side of the groove along an extending direction of the metal wires;
   wherein an inclination degree of a side wall of a portion of the groove where the protrusions are not formed is less than an inclination degree of a side wall of each of the protrusions.

2. The array substrate of claim 1, wherein the thin-film transistor layer comprises a first insulating layer and an interlayer insulating layer sequentially stacked on the flexible substrate;
   each of the driving circuit units comprises an active layer formed between the flexible substrate and the first insulating layer, and a first metal layer formed between the first insulating layer and the interlayer insulating layer,
   wherein the groove penetrates the interlayer insulating layer.

3. The array substrate of claim 2, wherein the groove penetrates the interlayer insulating layer and the first insulating layer, and extends into the flexible substrate.

4. The array substrate of claim 2, wherein the plurality of metal wires are formed above the interlayer insulating layer and comprise data lines extending from sources or drains,
   wherein the protrusions are arranged at positions where the groove overlaps the data lines.

5. The array substrate of claim 4, wherein the protrusions protrude from edges of the groove to outside of the groove along the extending direction of the metal wires, and widths of the protrusions are less than a width of the groove.

6. The array substrate of claim 4, wherein the protrusions corresponding to adjacent metal wires are located on opposite sides of the groove.

7. The array substrate of claim 6, wherein adjacent protrusions on a same side of the groove have different widths.

8. The array substrate of claim 7, wherein each of the protrusions has a trapezoidal or inverted trapezoidal shape on a plane where the interlayer insulating layer extends.

9. The array substrate of claim 2, wherein the array substrate further comprises a second insulating layer and a second metal layer,
   wherein the second insulating layer is located on a side of the first metal layer away from the first insulating layer, and the second metal layer is located between the second insulating layer and the interlayer insulating layer, and
   wherein the groove penetrates the interlayer insulating layer, the second insulating layer, and the first insulating layer, and extends into the flexible substrate.

10. A display panel, wherein the display panel comprises an array substrate, comprising:
    a flexible substrate;
    a thin-film transistor layer located on a surface of the flexible substrate;
    a planarization layer located on a side surface of the thin-film transistor layer away from the flexible substrate; and
    a pixel electrode layer located on a surface of the planarization layer away from the flexible substrate,
    wherein the thin-film transistor layer comprises a plurality of driving circuit units and a plurality of metal wires, a groove is defined between adjacent driving circuit units and is filled with organic insulating materials, and the plurality of metal wires extend across the groove; and wherein a plurality of protrusions are formed at positions where the groove overlaps the plurality of metal wires, and the protrusions are distributed on at least one side of the groove along an extending direction of the metal wires;

wherein an inclination degree of a side wall of a portion of the groove where the protrusions are not formed is less than an inclination degree of a side wall of each of the protrusions.

11. The display panel of claim 10, wherein the thin-film transistor layer comprises a first insulating layer and an interlayer insulating layer sequentially stacked on the flexible substrate;

each of the driving circuit units comprises an active layer formed between the flexible substrate and the first insulating layer, and a first metal layer formed between the first insulating layer and the interlayer insulating layer, wherein the groove penetrates the interlayer insulating layer.

12. The display panel of claim 11, wherein the groove penetrates the interlayer insulating layer and the first insulating layer, and extends into the flexible substrate.

13. The display panel of claim 11, wherein the plurality of metal wires are formed above the interlayer insulating layer and comprise data lines extending from sources or drains, wherein the protrusions are arranged at positions where the groove overlaps the data lines.

14. The display panel of claim 13, wherein the protrusions protrude from edges of the groove to outside of the groove along the extending direction of the metal wires, and widths of the protrusions are less than a width of the groove.

15. The display panel of claim 13, wherein the protrusions corresponding to adjacent metal wires are located on opposite sides of the groove.

16. The display panel of claim 15, wherein adjacent protrusions on a same side of the groove have different widths.

17. The display panel of claim 16, wherein each of the protrusions has a trapezoidal or inverted trapezoidal shape on a plane where the interlayer insulating layer extends.

18. The display panel of claim 11, wherein the array substrate further comprises a second insulating layer and a second metal layer, wherein the second insulating layer is located on a side of the first metal layer away from the first insulating layer, and the second metal layer is located between the second insulating layer and the interlayer insulating layer, and wherein the groove penetrates the interlayer insulating layer, the second insulating layer, and the first insulating layer, and extends into the flexible substrate.

19. An array substrate, comprising:

a flexible substrate;

a thin-film transistor layer located on a surface of the flexible substrate;

a planarization layer located on a side surface of the thin-film transistor layer away from the flexible substrate; and a pixel electrode layer located on a surface of the planarization layer away from the flexible substrate, wherein the thin-film transistor layer comprises a plurality of driving circuit units and a plurality of metal wires, a groove is defined between adjacent driving circuit units and is filled with organic insulating materials, and the plurality of metal wires extend across the groove; and wherein a plurality of protrusions are formed at positions where the groove overlaps the plurality of metal wires, and the protrusions are distributed on at least one side of the groove along an extending direction of the metal wires;

wherein the thin-film transistor layer comprises a first insulating layer and an interlayer insulating layer sequentially stacked on the flexible substrate;

each of the driving circuit units comprises an active layer formed between the flexible substrate and the first insulating layer, and a first metal layer formed between the first insulating layer and the interlayer insulating layer.

* * * * *